(12) United States Patent
Chang et al.

(10) Patent No.: US 9,437,823 B2
(45) Date of Patent: Sep. 6, 2016

(54) PRODUCTION DEVICE FOR A GRAPHENE THIN FILM

(71) Applicant: Chung-Ang University Industry—Academy Cooperation Foundation, Seoul (KR)

(72) Inventors: Suk Tai Chang, Seoul (KR); Yeongun Ko, Seoul (KR)

(73) Assignee: Chung-Ang University Industry-Academy Cooperation Foundation, Seoul (KR)

( * ) Notice: Subject to any disclaimer, the term of this patent is extended or adjusted under 35 U.S.C. 154(b) by 163 days.

(21) Appl. No.: 14/446,464

(22) Filed: Jul. 30, 2014

(65) Prior Publication Data

US 2014/0331920 A1   Nov. 13, 2014

Related U.S. Application Data

(63) Continuation-in-part of application No. 14/345,979, filed as application No. PCT/KR2011/007189 on Sep. 29, 2011, now Pat. No. 9,388,050.

(30) Foreign Application Priority Data

Sep. 23, 2011  (KR) ........................ 10-2011-0096441

(51) Int. Cl.
| | |
|---|---|
| *B05C 5/02* | (2006.01) |
| *H01L 51/00* | (2006.01) |
| *H01L 29/16* | (2006.01) |
| *H01L 31/18* | (2006.01) |
| *C01B 31/04* | (2006.01) |
| *B05C 11/02* | (2006.01) |
| *H01L 29/778* | (2006.01) |

(52) U.S. Cl.
CPC ....... *H01L 51/0045* (2013.01); *C01B 31/0476* (2013.01); *H01L 29/1606* (2013.01); *H01L 31/1884* (2013.01); *B05C 5/0208* (2013.01);
(Continued)

(58) Field of Classification Search
CPC ........ B05D 1/26; B05D 1/40; B05D 3/0218; B05D 3/12; B05D 7/00; B05D 2202/00; B05D 2203/00; B05D 2401/20
USPC ................. 118/120, 238, 241–243; 427/356; 15/93.1, 93.4, 97.1, 102; 101/123, 126
See application file for complete search history.

(56) References Cited

U.S. PATENT DOCUMENTS

| | | | | |
|---|---|---|---|---|
| 4,520,726 A | * | 6/1985 | Rouly | ................. B41F 15/0818 101/123 |
| 5,660,632 A | * | 8/1997 | Volpe, Jr. | .............. B05C 11/044 101/114 |

(Continued)

FOREIGN PATENT DOCUMENTS

| | | |
|---|---|---|
| KR | 10-2009-0059871 A | 6/2009 |
| KR | 10-2011-0016287 A | 2/2011 |
| KR | 10-2011-0068881 A | 6/2011 |

OTHER PUBLICATIONS

In Kyu Moon, et al., "Reduced graphene oxide by chemical graphitization," Nature Communications, (vol. 1), (Article No. 73), (Sep. 21, 2010).

*Primary Examiner* — Laura Edwards
(74) *Attorney, Agent, or Firm* — Hammer & Associates, P.C.

(57) ABSTRACT

The present invention relates to a production device for graphene thin film. The production device for graphene thin film according to the present invention may comprise a deposition plate in contact with a substrate at an obtuse or acute angle, wherein the substrate is coated with a graphene oxide solution; and a reciprocating linear motion device connected to the deposition plate to put the deposition plate into reciprocating linear motion.

1 Claim, 15 Drawing Sheets

(52) U.S. Cl.
CPC .......... *B05C 11/026* (2013.01); *H01L 29/7781* (2013.01); *Y02E 10/50* (2013.01)

(56) References Cited

U.S. PATENT DOCUMENTS

| | | | |
|---|---|---|---|
| 7,357,690 B2 * | 4/2008 | Tsuruoka | B82Y 10/00 427/355 |
| 2004/0170765 A1 * | 9/2004 | Ederer | B05C 11/023 427/355 |
| 2004/0187716 A1 * | 9/2004 | Pham-Van-Diep | B41F 15/42 101/123 |
| 2010/0239869 A1 | 9/2010 | Huang et al. | |
| 2011/0143107 A1 | 6/2011 | Steinig-Nowakowski et al. | |

* cited by examiner

PRODUCTION DEVICE FOR A GRAPHENE THIN FILM

RELATED APPLICATION

This application is a continuation-in-part of and claims the benefit of U.S. patent application Ser. No. 14/345,979 filed Mar. 20, 2014, now U.S. Pat. No. 9,388,050, which was filed claiming the benefit of PCT international application No. PCT/KR2011/007189 filed Sep. 29, 2011

TECHNICAL FIELD

The present invention relates to a production device for graphene thin film.

BACKGROUND ART

Graphene is a two-dimensional novel material composed of a single layer of $sp^2$-hybridized carbon atoms in a honeycomb lattice. Graphene is known as a good conductor that is very stable structurally and chemically and carries electrons approximately 100 times faster than silicone and approximately 100 times higher current than copper does. Further, graphene is approximately 200 times stronger in mechanical strength and more flexible than steel and has a heat conductivity of about 5,300 W/m·K and a good optical property such as a light transmittance of 97.7%. Composed of carbon atoms alone, graphene has a vast specific surface area of 2,600 $m^2/g$. Such characteristics of graphene enables the use of graphene for transparent electrodes, touch panels, flexible displays, high-sensitivity sensors, catalysts, and so forth and advantageously allows graphene in combination with another material to form a composite material. In recent years, graphene has emerged as a promising second-generation semiconductor material.

Currently, there are three different production methods for graphene: the mechanical exfoliation method, the chemical vapor deposition (CVD) growth, and the chemical exfoliation method. Depending on the production methods, graphenes have different properties and hence different applications. The mechanical exfoliation method is a method of using a mechanical force to exfoliate graphite as a base material of graphene into graphene flakes. The mechanical exfoliation method that uses a scotch tape to produce graphene flakes has been a great contribution to the early studies on graphene. The graphene produced by the mechanical exfoliation method is of a relatively high quality but disadvantageous in regards to poor applicability and difficulty of production on a large scale. The CVD growth makes the use of the fact that a metal catalyst such as of nickel or copper is capable of adsorbing carbon atoms at high temperature. Thus, the CVD growth is a method of exposing graphene to a metal catalyst and a methane/hydrogen gas mixture at high temperature of 1,000° C. to have carbon melt on the surface of the metal catalyst and then cooling down to crystallize the carbon atoms on the surface of the metal catalyst. The graphene produced by the CVD growth is of a high quality but needs to control the conditions, such as the type and thickness of the metal catalyst, the reaction time, the cooling rate, the concentration of the reaction gas, etc. Further, the fabrication of CVD-grown graphene thin film requires an additional process of transferring the produced graphene to a desired substrate. Most of all, the high-temperature condition of the process such as 1,000° C. is a huge obstacle to the industrial use of the CVD growth. The chemical exfoliation method is a method of using an oxidizing agent or a surfactant to chemically exfoliate graphite in a solution state into graphene flakes. The oxidized graphene flakes produced with an oxidizing agent can return to the graphene with a reducing agent such as hydrazine, etc. The chemical exfoliation method has a disadvantage that the graphene oxide flakes separated by oxidization are not completely reduced to remain many defects, ending up deteriorating the electrical properties of the graphene. But, the chemical exfoliation method involves relatively soft conditions, has easiness of graphene production on large scale and allows production of graphene into various structures such as graphene-based hydrogel particles or graphene paper as well as graphene thin film. Further, the graphene produced by the chemical exfoliation method is easy to form a composite with another material and uniquely distinctive from the other graphene production methods in the aspect of applicability. Therefore, many studies have been made to extend the fields of the applications of graphene using the chemical exfoliation method.

The most important technique required to use the graphene oxides produced by the chemical exfoliation method for such applications as transparent electrodes, touch panels, flexible displays, high-sensitivity sensors, etc. is to uniformly apply the graphene oxides existing in the solution state on a desired substrate.

Conventionally, the graphene oxide flakes in the solution state are fabricated in the form of film through various coating methods and self-assembling methods, such as spin coating, spray coating, vacuum filtration, Langmuir-Blodgett (LB) assembly, layer-by-layer (LBL) assembly, etc.

The spin coating is the most widely used coating method, where a predetermined amount of a graphene oxide solution is put dropwise on a substrate, which is rotated at high spinning rate to coat the substrate by the centrifugal force imposed on the solution. In the case of the spin coating, an extremely high spin speed causes a failure to combine the graphene oxide flakes closely together and thus deteriorates the quality of the film on the whole; whereas an extremely low spinning rate ends up with the film too thick to acquire a uniform coating, making the film difficult to use as a transparent electrode. Further, the spin coating has the difficulty in acquiring a uniform coating on a large-area substrate.

The spray coating, which is a coating method to spray a graphene oxide solution on a substrate, makes it easy to get a coating on a large-area substrate and involves a process fast and simple. But, the spray coating causes graphene oxide flakes to aggregate before the solution sprayed reaches the substrate, ending up producing a film not uniform in the whole area.

The vacuum filtration is a coating method to pass a graphene oxide solution through a fine filter paper and filter graphene oxide flakes out, forming a film with the graphene oxide flakes. The vacuum filtration makes it possible to obtain a uniformly coated film and easy to control the thickness of the film, but it consumes a large amount of the graphene oxide solution and takes a long time for the process. More disadvantageously, the vacuum filtration requires an additional process to transfer the film formed on the fine filter paper to a desired substrate.

The Langmuir-Blodgett (LB) assembly is a coating method to immerse a substrate vertically in a solution having graphene oxide flakes arranged on the surface and then slowly lift it at a constant rate so that the graphene oxide flakes can self-assemble on the substrate. The LB assembly forms a relatively uniform film but takes a long time for the process, with the difficulty to form a coating on a large-area substrate.

The lay-by-lay (LBL) assembly is a coating method to apply different surface charges on the graphene flakes and assemble a film using the static attraction. For the LBL assembly, functional groups are affixed to the graphene flakes to prepare a graphene oxide solution having the positive electric charge and a graphene oxide solution having the negative electric charge, and the substrate is immersed alternately in the two solutions to build up the graphene oxide flakes in a lay-by-lay manner. The LBL assembly offers good workability, but it needs a pretreatment process for affixing functional groups to the graphene flakes, uses a great amount of the graphene oxide solution and takes too much time.

Accordingly, in order to overcome the problems with the conventional coating methods for fabricating a graphene thin film using graphene oxides prepared by the chemical exfoliation method, there is a demand for a novel production device for graphene thin film that can fabricate a uniform and large-area graphene thin film for transparent electrode using a small amount of a graphene oxide solution in a short process time without limiting the area of the substrate.

DISCLOSURE OF INVENTION

It is therefore an object of the present invention to provide a production device for graphene thin film that enables to fabricate a uniform and large-area graphene thin film in a short process, and a transparent electrode including the graphene thin film prepared by the production method.

In an attempt to achieve the object of the present invention, there is provided a production device for graphene thin film, comprising: a deposition plate in contact with a substrate at an obtuse or acute angle, wherein the substrate is coated with a graphene oxide solution; and a reciprocating linear motion device connected to the deposition plate to put the deposition plate into reciprocating linear motion.

The production device according to the present invention may further comprise a holder for supporting the deposition plate.

In the present invention, the holder may comprise a body; a groove formed in a side of the body to receive an end portion of the deposition plate; connecting members respectively extending from both end portions of the body; and an axis receiving hole respectively formed in the connecting members.

In the present invention, the reciprocating linear motion device may comprise an axis receiving hole, an end portion of the reciprocating linear motion device may be inserted between the connecting members of the holder, so that the axis receiving hole of the holder may be aligned with the axis receiving hole of the reciprocating linear motion device.

The production device according to the present invention may further comprise an angle adjusting device for rotatably supporting the holder, for adjusting an angle between the substrate and the deposition plate, and for maintaining the adjusted angle.

In the present invention, the angle adjusting device may comprise a rotating axis respectively inserted into the axis receiving hole of the holder and the axis receiving hole of the reciprocating linear motion device; and a fixing member engaging with the rotating axis to fix the holder and the reciprocating linear motion device.

In the present invention, the rotating axis and the fixing member may be screw-coupled.

The production device according to the present invention may further comprise a support fixture for supporting the substrate.

The production device according to the present invention may further comprise a height adjusting device for adjusting a height of the support fixture to adjust an angle between the substrate and the deposition plate.

The production device according to the present invention may further comprise a heating device installed in the support fixture to heat the substrate; and a temperature adjusting device for adjusting a heating temperature of the heating device.

The production device according to the present invention may further comprise an injecting device for injecting the graphene oxide solution; and an injection tube connected to the injecting device.

In the present invention, the deposition plate may comprise a fixing member for fixing the injection tube.

The production device for graphene thin film according to the present invention can prepare a uniform and large-area graphene thin film for transparent electrode using a small amount of a graphene oxide solution in a short process time without limiting the area of the substrate.

DETAILED DESCRIPTION OF THE INVENTION

Hereafter, the preferred embodiments of the present invention will be described in detail with reference to the accompanying drawings.

Figure 1:
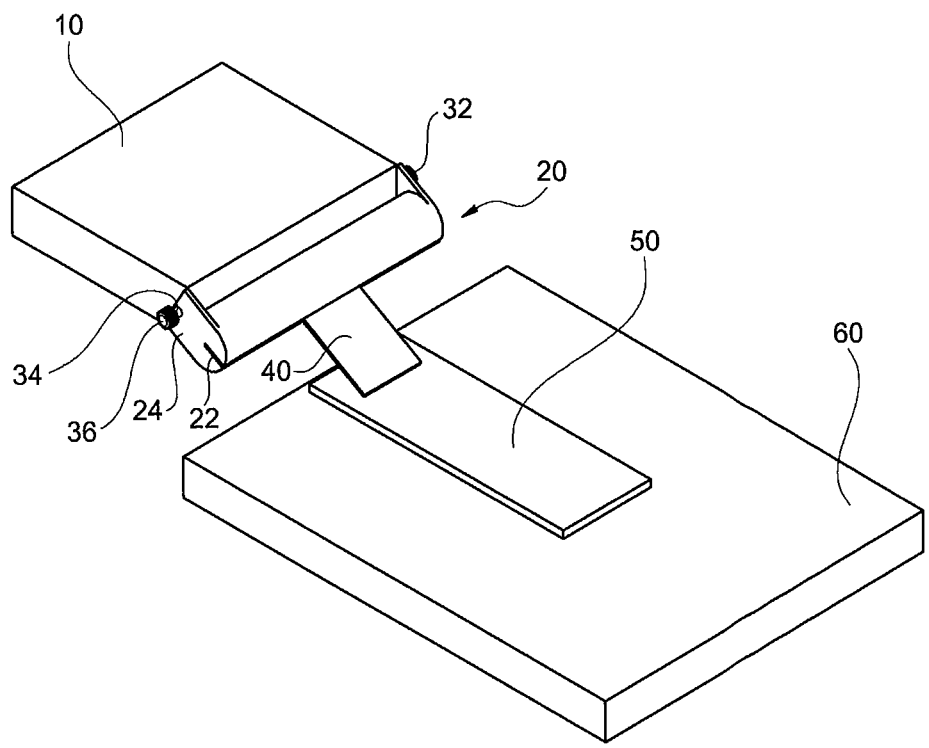
FIG. 1 is a perspective view showing a production device for graphene thin film according to one exemplary embodiment of the present invention.
Figure 2:
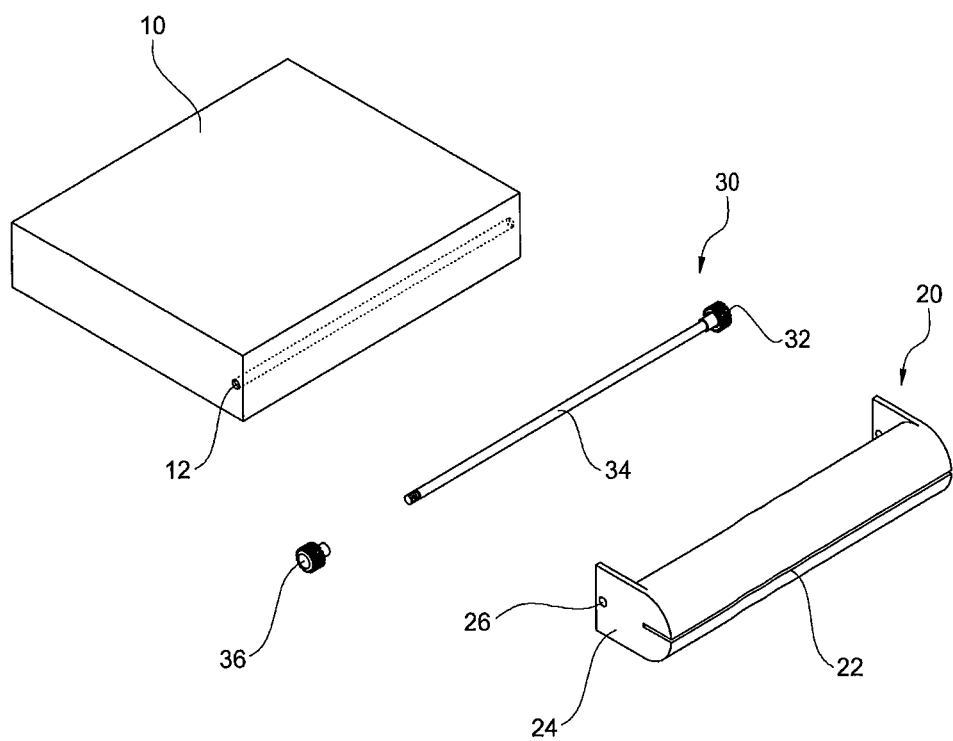
FIG. 2 is an exploded perspective view showing a production device for graphene thin film according to one exemplary embodiment of the present invention.

FIG. 1 is a perspective view showing a production device for graphene thin film according to one exemplary embodiment of the present invention, and FIG. 2 is an exploded perspective view, the production device according to the present invention may comprises a reciprocating linear motion device 10, a holder 20, an angle adjusting device 30, a deposition plate 40, a substrate 50, a support fixture 60.

The reciprocating linear motion device 10 is connected to the deposition plate 40, and plays a role in putting the deposition plate 40 into reciprocating linear motion. The reciprocating linear motion device 10 may have a driving source such as electric power, pneumatic power and hydraulic power. The reciprocating linear motion device 10 may comprise one or more mechanism such as a piston and cylinder mechanism, rack and pinion mechanism. The reciprocating linear motion device 10 may be for example an actuator or linear stage. In the drawings, only an end portion of the reciprocating linear motion device 10 is illustrated. The end portion of the reciprocating linear motion device 10 is illustrated as a plate shape in the drawings. However, a shape of the reciprocating linear motion device 10 is not limited to the drawings, and can be variously modified.

Referring to FIG. 2, an axis receiving hole 12 may be formed in the end portion of the reciprocating linear motion device 10. The axis receiving hole 12 may receive a rotating axis 34 of the angle adjusting device 30. The axis receiving hole 12 may be long hole which passes through the end portion of the reciprocating linear motion device 10 in a longitudinal direction. The rotating axis 34 may pass through the axis receiving hole 12, so that the rotating axis 34 may be inserted into the axis receiving hole 12.

The holder 20 plays a role in supporting and rotating the deposition plate 40. Referring to FIG. 2, the holder 20 may comprise a body, a groove 22, connecting members 24 and an axis receiving hole 26. In the drawings, the body of the holder 20 is illustrated as cylinder shape. However, the body may have other shape, for example the body may consist of semi-cylinder, polyhedron and so on.

The groove 22 may be formed in a side of the body. The groove may play a role in receiving an end portion of the deposition plate 40. The groove 22 may be formed in a longitudinal direction in the side of the body. In the drawings, the groove 22 may be continuously formed in the body. A length of the groove 22 may be the same as entire length of the body. However, the length of the groove 22 may be appropriately adjusted if necessary. Preferably, a thickness of the groove 22 may be nearly the same as a thickness of the deposition plate 40. A depth of the groove 22 may be appropriately adjusted within a range in which the deposition plate 40 is not separated from the groove 22.

The connecting members 24 may be formed by respectively extending from both end portions of the body. That is, the number of connecting members 24 may be two. The connecting members 24 may have plate shape. However, a shape of the connecting members 24 may be appropriately modified if necessary. Also, a size of the connecting members 24 may be appropriately adjusted if necessary.

The axis receiving hole 26 may be respectively formed in each connecting member 24. The axis receiving hole 26 may play a role in receiving the rotating axis 34. A diameter of the axis receiving hole 26 may be the same as a diameter of the rotating axis 34, or may be slightly larger than the diameter of the rotating axis 34.

The end portion of the reciprocating linear motion device 10 may be inserted between the connecting members 24 of the holder 20, so that the axis receiving hole 26 of the holder 20 may be aligned with the axis receiving hole 12 of the reciprocating linear motion device 10.

The angle adjusting device 30 may play a role in rotatably supporting the holder 20, in adjusting an angle between the substrate 50 and the deposition plate 40, and in maintaining the adjusted angle. Referring to FIG. 2, the angle adjusting device 30 may comprise the rotating axis 34 and a fixing member 32 and 36.

The rotating axis 34 may be respectively inserted into the axis receiving hole 26 of the holder 20 and the axis receiving hole 12 of the reciprocating linear motion device 10. A screw thread for screw-coupling with the fixing member 32 and 36 may be formed on an outer circumference surface of one end portion or both end portions of the rotating axis 34.

The fixing member 32 and 36 may engage with the rotating axis 34 to fix the holder 20 and the reciprocating linear motion device 10. The fixing member 32 and 36 may be a kind of nut. A screw thread for screw-coupling with the rotating axis 34 may be formed on an inner circumference surface of the fixing member 32 and 36. Both fixing member 32 and 36 may be screw-coupled with the rotating axis 34. Also, one fixing member 32 may be formed integrally with the rotating axis 34, in this case only other fixing member 36 may be screw-coupled with the rotating axis 34.

The holder 20 and the angle adjusting device 30 are installed at the reciprocating linear motion device 10, and then the deposition plate 40 is inserted into the groove 22 of the holder 20, and then the angle between the deposition plate 40 and the substrate 50 may be adjusted by rotation of the rotating axis 34. Then, the adjusted angle may be maintained by tightening the fixing member 32 and 36 to fix the holder 20 in the reciprocating linear motion device 10.

Meanwhile, unlike the drawings, the holder 20 may integrally comprise a rotating axis. In this case, the rotating axis of the holder 20 may be inserted into the reciprocating linear motion device 10, and then the holder 20 may be rotated. That is, any structure which may rotatably support the holder 20 and may adjust and maintain the angle, is applicable to the present invention.

The deposition plate 40 may be in contact with the substrate 50 at an obtuse or acute angle. The deposition plate 40 may be attached and detached to the holder 20 by means of the groove 22. The deposition plate 40 may be made of metal, plastic, ceramic or wood. For example, the deposition plate 40 may be made of glass, polymer film or silicon wafer similarly with the substrate 50. A size of the deposition plate 40 is not limited and may be appropriately adjusted if necessary.

The substrate 50 is a coating substrate which is coated with a graphene oxide solution. The substrate 50 may be made of glass, polymer film or silicon wafer. A size of the substrate 50 is not limited and may be appropriately adjusted if necessary. The angle between the deposition plate 40 and the substrate 50 may be adjusted by means of the holder 20 and the angle adjusting device 30 at the acute or obtuse angle. In case of the acute angle, the angle may be 5 to 85°. In case of the obtuse angle, the angle may be 95 to 175°.

The support fixture 60 may play a role in supporting the substrate 50. The support fixture 60 may be made of metal, plastic, ceramic or wood. A size of the support fixture 60 is not limited and may be appropriately adjusted if necessary. A supporting member such as a leg may be installed at a lower part of the support fixture 60. For example, four legs may be installed at four corners of the support fixture 60.

Figure 3:
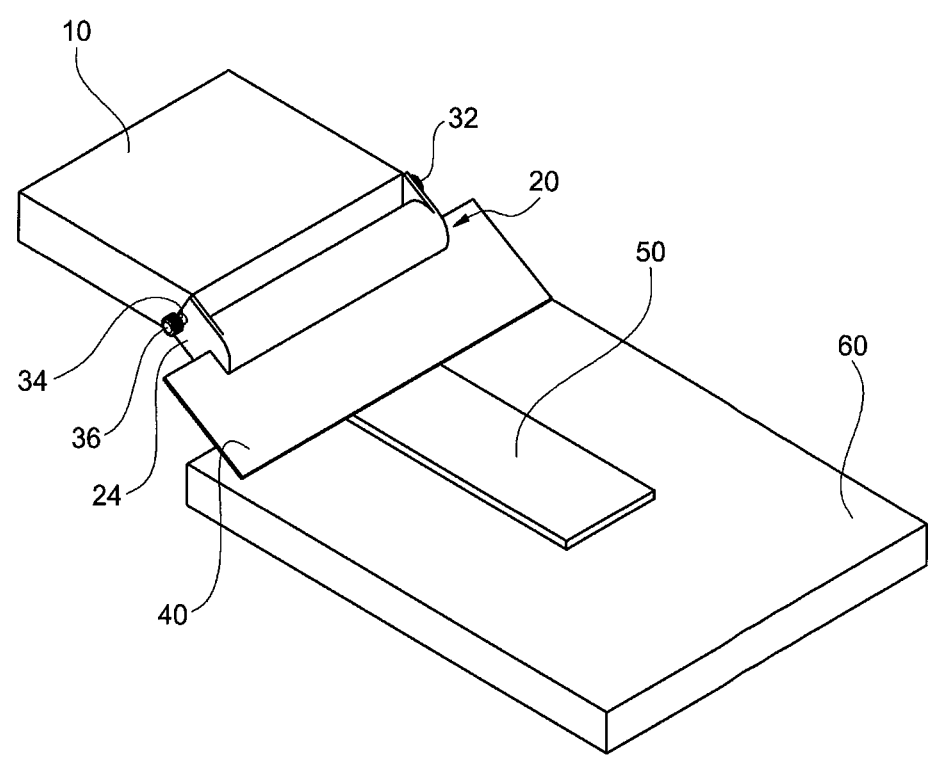
FIG. 3 is a perspective view showing a production device for graphene thin film using a large area deposition plate according to one exemplary embodiment of the present invention.

FIG. 3 is a perspective view showing a production device for graphene thin film using a large area deposition plate according to one exemplary embodiment of the present invention. In the present invention, a variety of the deposition plate 40 in size may be used. In case of using the large area deposition plate 40, large area coating is possible.

Figure 4:
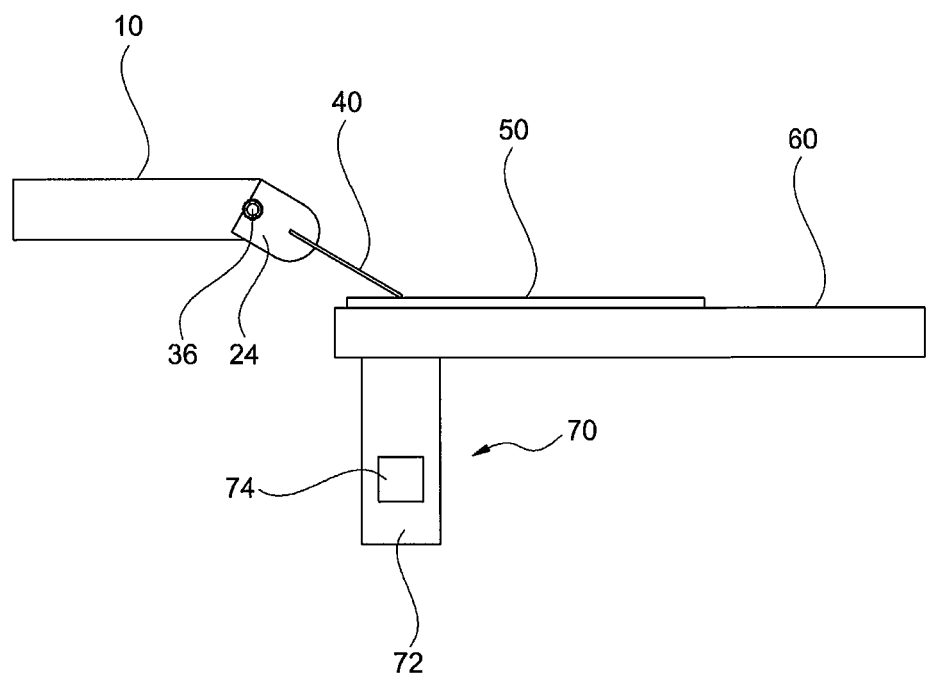
FIG. 4 and FIG. 5 are a side view showing a production device for graphene thin film comprising a height adjusting device according to one exemplary embodiment of the present invention.
Figure 5:
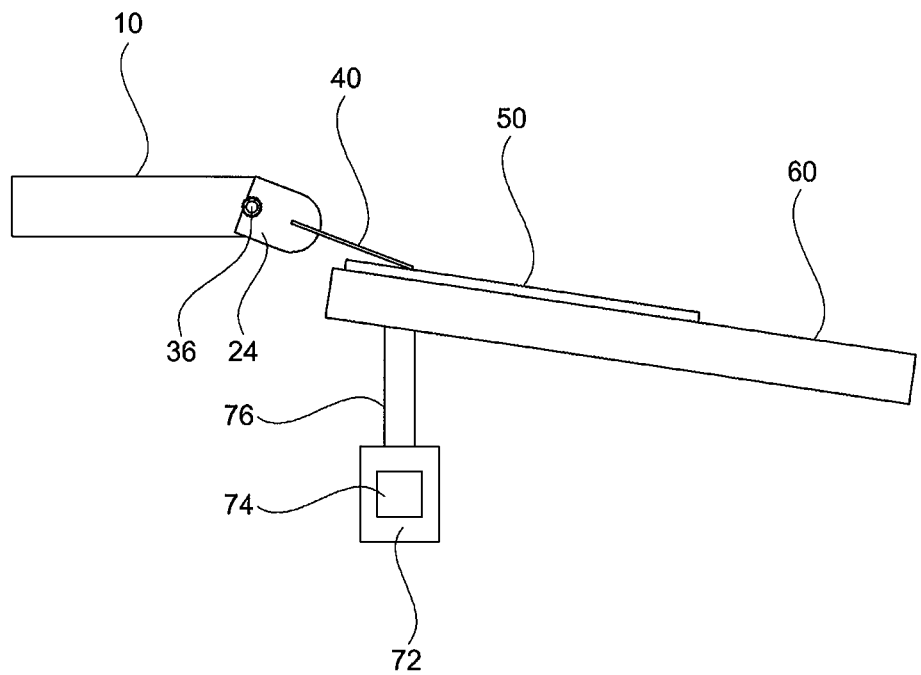

FIG. 4 and FIG. 5 are a side view showing a production device for graphene thin film comprising a height adjusting device according to one exemplary embodiment of the present invention. Also, the angle between the deposition plate 40 and the substrate 50 may be adjusted by moving the support fixture 60 in a vertical direction. That is, in the present invention, the angle between the deposition plate 40 and the substrate 50 may be adjusted by adjusting a height of the support fixture 60 as well as by rotating the holder 20.

A height adjusting device 70 may play a role in adjusting the height of the support fixture 60, thereby adjusting the angle between the deposition plate 40 and the substrate 50. The height adjusting device 70 may be installed at the lower part or lateral part of the support fixture 60. Preferably, the height adjusting device 70 may be installed at a region where the deposition plate 40 and the substrate 50 are in contact with each other. An adjustable height is not limited and for example may be 0 to 20 cm.

The height adjusting device 70 may have a driving source such as electric power, pneumatic power and hydraulic power. The height adjusting device 70 may comprise one or more mechanism such as the piston and cylinder mechanism, rack and pinion mechanism. The height adjusting device 70 may be for example a lifting device, in other words lift or lifter. FIG. 4 and FIG. 5 illustrate the height adjusting device 70 which comprises a cylinder 72, a piston 76 movably installed in the cylinder 72, and a motor 74 for driving the piston 76. FIG. 5 illustrates a lifted state of the support fixture 60.

Also, the height adjusting device 70 may have a manually adjustable structure. For example, the height adjusting device 70 may comprise a vertical member having a plurality of holes formed at regular intervals in a height direction of the vertical member. In this case, the support fixture 60 may comprise a protrusion. This protrusion may be inserted into one of the plurality of holes at an appropriate height. Thus, the height of the support fixture 60 may be adjusted while the support fixture 60 may be supported.

Figure 6:
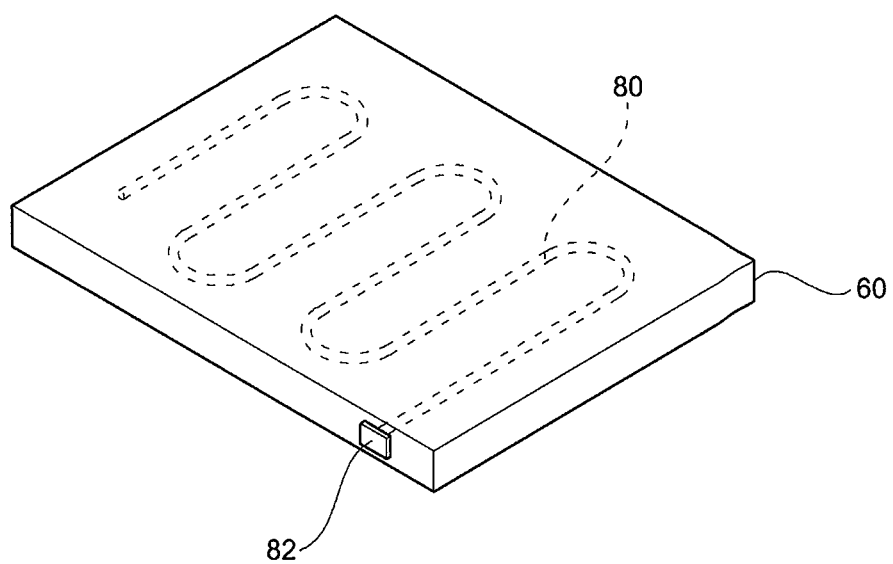
FIG. 6 is a perspective view showing a support fixture provided with a heating device and a temperature adjusting device.

FIG. 6 is a perspective view showing a support fixture provided with a heating device and a temperature adjusting device. The support fixture 60 may be configured so that a temperature of the support fixture 60 may be controlled. Thus, the support fixture 60 may dry the film during a coating process or after the coating process.

A heating device 80 and a temperature adjusting device 82 may be installed in or on the support fixture 60. The heating device 80 may play a role in heating the substrate 50. The temperature adjusting device 82 may play a role in adjusting a heating temperature of the heating device 80. In the drawings, a heating wire is illustrated as the heating device 80. The heating wire may have a zigzag shape and may be inserted inside the support fixture 60. However, a kind of the heating device 80 is not limited to the drawings, and a variety of the heating device 80 may be used. A kind of the temperature adjusting device 82 is not limited and a variety of the temperature adjusting device 82 may be used. The temperature adjusting device 82 may be for example a thermostat.

Figure 7:
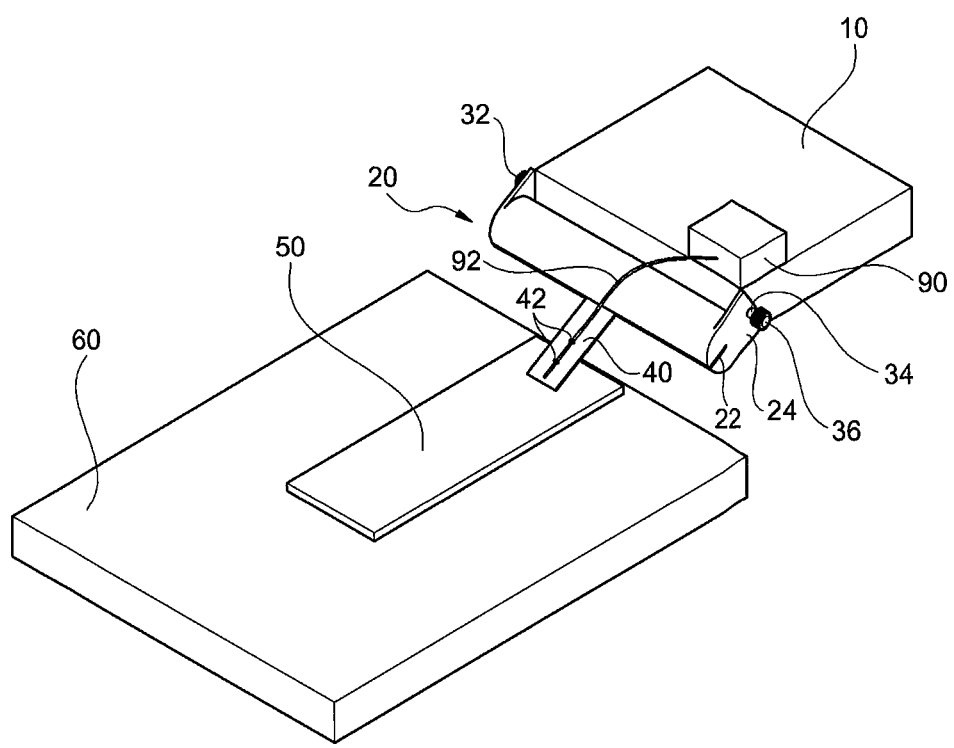
FIG. 7 is a perspective view showing a production device for graphene thin film comprising an injecting device and an injection tube according to one exemplary embodiment of the present invention.

FIG. 7 is a perspective view showing a production device for graphene thin film comprising an injecting device and an injection tube according to one exemplary embodiment of the present invention. An injecting device 90 for injecting the graphene oxide solution and an injection tube 92 connected to the injecting device 90 may be installed.

The injecting device 90 may comprise injection means such as a pump for injecting the graphene oxide solution and may comprise adjustment means such as a valve for adjusting an injection volume. In the drawings, the injecting device 90 is installed on the reciprocating linear motion device 10. However, a location of the injecting device 90 is not limited, and the injecting device 90 may be installed at other location.

The injecting device 90 may automatically inject a coating solution at a speed of 1 to 6000/μl/min through the injection tube 92 in a direction of the acute or obtuse angle formed by the contact of the deposition plate 40 and the substrate 50.

The injection tube 92 may be a long tube which extends from the injecting device 90 to the deposition plate 40. The injection tube 92 may be a flexible tube or hard tube. The injection tube 92 may be arranged on a front side or rear side of the deposition plate 40. The injection tube 92 may be installed near a contact line of the deposition plate 40 and the substrate 50.

The deposition plate 40 may comprise a fixing member 42 for fixing the injection tube 92. The coating solution may be stably injected through the injection tube 92 fixed by the fixing member 42. For example, the fixing member 42 may consist of a loop, clip or protrusion. The injection tube 92 may be inserted into the fixing member 42 and may be fixed. A plurality of fixing members 42 may be installed at regular intervals.

Also, The present invention is directed to a production method for graphene thin film that includes: (a) injecting a graphene oxide solution in the direction of an obtuse or acute angle between a substrate placed in parallel with a reciprocating linear motion device and a deposition plate connected to the reciprocating linear motion device and in contact with the substrate; and (b) using the reciprocating linear motion device to put the deposition plate connected to the reciprocating linear motion device into reciprocating linear motion while the deposition plate is in contact with the substrate, thereby applying the graphene oxide solution onto the substrate.

Hereinafter, a detailed description will be given as to a production method for graphene thin film according to the present invention.

In accordance with the production method of the present invention, the step (a) can be first performed for the purpose of fabricating a graphene thin film, where the step (a) involves injecting the graphene oxide solution in the direction of the obtuse or acute angle between the substrate placed in parallel with the reciprocating linear motion device and the deposition plate connected to the reciprocating linear motion device and in contact with the substrate.

In the step (a), when the graphene oxide solution is injected in the direction of the obtuse or acute angle between the substrate and the deposition plate in contact with each other, a capillary action renders the graphene oxide solution sucked up in the direction of the acute or obtuse angle between the substrate and the deposition plate. The graphene oxide solution sucked up in the direction of the acute or obtuse angle between the substrate and the deposition plate in contact with each other can form a meniscus between the substrate and the deposition plate and a wet film on the surface of the substrate.

The reciprocating linear motion device available in the step (a) of the present invention is not specifically limited in its type and may include any device capable of producing a reciprocating linear motion at a constant speed.

The substrate available in the step (a) of the present invention is not specifically limited in its type and preferably includes at least one selected from the group consisting of a glass substrate, a polymer film, and a silicon wafer.

The glass substrate as used herein is not specifically limited in its type and may include any glass substrate generally used in the related art without limitation.

The polymer film as used herein is also not specifically limited and may include at least one selected from the group consisting of, for example, a polyester film, a polyethylene film, a polyethylene terephthalate film, a polypropylene film, a polydimethylsiloxane film, a poly-4-vinylphenol film, a polymethyl methacrylate film, a polyvinylidene fluoride film, a polystyrene film, a polycarbonate film, a polyimide film, a cellulose film, a polyvinyl chloride film, a polytetrafluoroethylene film, a polyvinyl alcohol film, and a polyurethane film. Preferably, the polymer film may be a polyethylene film or a polydimethylsiloxane film.

The deposition plate available in the step (a) of the present invention is not specifically limited in its type and preferably includes a glass plate or a plastic plate.

The glass plate or the plastic plate is not specifically limited in its type and may be selected properly depending on the desired size of the graphene thin film. This makes it possible to fabricate a large-area graphene thin film.

The size of the substrate and the deposition plate used in the step (a) of the present invention is not specifically limited and may be appropriately determined depending on a desired size of the graphene thin film. This allows the production of a large-area graphene thin film.

In the production method of the present invention, the acute angle between the substrate and the deposition plate in contact with each other is less than 90°, preferably 5° to 85°, more preferably 10° to 60°, most preferably 15° to 45°. The obtuse angle between the substrate and the deposition plate in contact with each other is less than 180°, preferably 95° to 175°, more preferably 100° to 150°, most preferably 105° to 135°. The acute angle less than 5° or the obtuse angle greater than 175° leads to a failure to put the deposition plate into reciprocating linear motion and deterioration in the quality of the graphene thin film formed on the substrate. The acute angle greater than 85° or the obtuse angle less than 95° possibly makes it difficult to inject the graphene oxide solution in the direction of the obtuse or acute angle between the substrate and the deposition plate in contact with each other and deteriorates the quality of the graphene thin film formed on the substrate.

In the production method of the present invention, the acute angle between the substrate and the deposition plate in contact with each other can be controlled to regulate the thickness of the graphene thin film and hence the transmittance and the sheet resistance of the graphene thin film in a desired range.

The volume of the graphene oxide solution injected in the step (a) is in the range of 1 µl to 100 µl per inch (length) of a contact interface between the substrate and the deposition plate in contact with each other. When the volume of the graphene oxide solution injected in the step (a) is less than 1 µl per inch (length) of the contact interface, the graphene oxide solution possibly vaporizes during its coating process. When the volume of the graphene oxide solution injected in the step (a) is greater than 100 µl per inch (length) of the contact interface, formation of the meniscus and the wet film from the graphene oxide solution cannot be uniform to cause deterioration in the quality of the graphene thin film formed on the substrate.

The concentration of the graphene oxide solution injected in the step (a) is in the range of 0.001 mg/ml to 20 mg/mg. When the concentration of the graphene oxide solution injected in the step (a) is less than 0.001 mg/ml, a large number of reciprocating linear motions of the deposition plate is required in order to form a uniform graphene thin film on the substrate, retarding the coating process time. When the concentration of the graphene oxide solution injected in the step (a) is greater than 20 mg/ml, the graphene oxide flakes in the graphene oxide solution aggregate, which leads to deterioration in the quality of the graphene thin film.

The production method of the present invention may include the step (b) in order to prepare a graphene thin film. The step (b) is using the reciprocating linear motion device to put the deposition plate connected to the reciprocating linear motion device into reciprocating linear motion while the deposition plate is in contact with the substrate, and thereby applying the graphene oxide solution onto the substrate.

The step (a) of the present invention forms a meniscus of the graphene oxide solution between the substrate and the deposition plate and a wet film on the substrate. Subsequent to the step (a), the step (b) uses the reciprocating linear motion device to put the deposition plate connected to the reciprocating linear motion device into reciprocating linear motion while the substrate and the deposition plate are in contact with each other. This can make the meniscus of the graphene oxide solution move in the motion direction of the deposition plate and cause a linear shear gradient in the wet film formed on the substrate, so the graphene oxide flakes in the meniscus become aligned and slanted in the moving direction of the meniscus by the shear force. Accordingly, the graphene oxide flakes in the meniscus are stuck on the substrate in the plate form. Further, the number of reciprocating linear motions of the deposition plate, that is, the reciprocating coating frequency increases to have more of the graphene oxide flakes stuck on the substrate. This makes the graphene oxide flakes laminate uniformly and forms a transparent graphene thin film.

Figure 8:
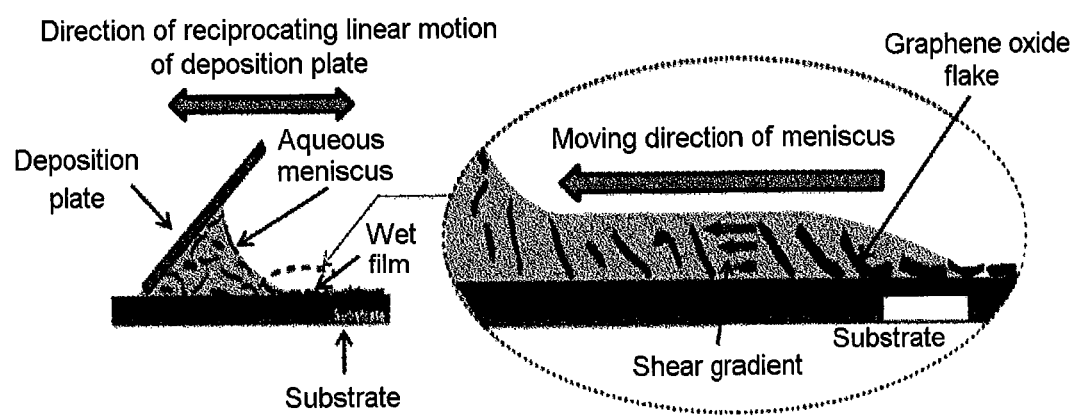
FIG. 8 is a mimetic diagram showing the meniscus of a graphene oxide solution formed between a substrate and a deposition plate and a wet film formed on the substrate.

FIG. 8 is a mimetic diagram showing a meniscus of the graphene oxide solution formed between the substrate and the deposition plate and a wet film formed on the substrate. As illustrated in FIG. 8, when the graphene oxide solution is injected in the direction of the obtuse or acute angle between the substrate and the deposition plate in contact with each other, the capillary action takes place to suck up the graphene oxide solution in the direction of the acute or obtuse angle between the substrate and the deposition plate to form an aqueous meniscus and a wet film on the substrate. Subsequently, the reciprocating linear motion device is used to put the deposition plate into reciprocating linear motion.

This forms a linear shear gradient in the wet film and makes the graphene oxide flakes align in the moving direction of the meniscus under the shear force and stick on the substrate in the plate form. Further, the number of the graphene oxide flakes stuck on the substrate increases with an increase in the number of reciprocating linear motions, that is, the reciprocating coating frequency, thereby forming a graphene thin film uniformly laminated.

In the step (b) of the present invention, when the deposition plate while in contact with the substrate is put into reciprocating linear motion using the reciprocating linear motion device, it is desirable to maintain the angle between the substrate and the deposition plate in contact with each other. If the angle between the substrate and the deposition plate in contact with each other is changed during the reciprocating linear motion of the deposition plate, the radius of the meniscus formed by the graphene oxide solution changes, which leads to a change in the thickness of the wet film and thus makes it difficult to produce a uniform graphene thin film.

In the step (b) of the present invention, the reciprocating linear motion speed of the deposition plate is not specifically limited and may be preferably 1 mm/s or greater. The reciprocating linear motion speed of the deposition plate less than 1 mm/s increases the evaporation of the solution occurring in the meniscus portion of the graphene oxide solution in contact with the substrate and causes precipitation of the graphene oxides, making it difficult to produce a uniform graphene thin film.

The upper limit of the reciprocating linear motion speed of the deposition plate is not specifically limited and may be, for example, 500 mm/s, preferably 100 mm/s, more preferably 40 mm/s. The reciprocating linear motion speed of the deposition plate greater than 500 mm/s increases the thickness of the wet film formed from the graphene oxide solution and causes a large quantity of graphene oxides to suspend, which also makes it difficult to produce a uniform graphene thin film.

In the production method of the present invention, the reciprocating linear motion speed of the deposition plate is controlled in the above-defined range to regulate the thickness of the graphene thin film and hence the transmittance and the sheet resistance of the graphene thin film in a desired range.

In the step (b) of the present invention, the reciprocating coating frequency of the graphene oxide solution by the reciprocating linear motion of the deposition plate is not specifically limited and may be preferably in the range of 1 to 100. The reciprocating coating frequency greater than 100 possibly retards the coating time of the graphene oxide solution and leads to a need for additional injection of the graphene oxide solution due to vaporization of the graphene oxide solution.

The production method for graphene thin film according to the present invention may further include the step (c), which is a step of preparing the graphene oxide solution, prior to the step (a).

In the step (c), the preparation method for the graphene oxide solution is not specifically limited and may be any preparation method commonly used in the related art. Preferably, the graphene oxide solution synthesized by the modified Hummers method using the solution process is centrifugally separated to disperse the graphene oxides uniformly to a thickness of 1 to 10 layers. The modified Hummers method using the solution process is well known in the related art.

The production method for graphene thin film according to the present invention may further include the step (d), which is pretreating the substrate, prior to the step (a).

The step (d) eliminates foreign substances from the substrate. The step (d) also provides hydrophilic functional groups for the surface of the substrate so that the graphene oxide solution can form a meniscus between the substrate and the deposition plate and a wet film on the substrate.

If the substrate is a glass substrate or a silicon wafer, the pretreatment process on the substrate in the step (d) involves immersing the substrate in a piranha solution and then washing it with deionized water. More specifically, the substrate is immersed in a piranha solution for 20 minutes to one hour and then washed with deionized water on the surface once or more.

If the substrate is a polymer film, the pretreatment process on the substrate in the step (d) involves conducting a plasma treatment on the substrate.

The production method for graphene thin film according to the present invention may further include the step (e), which is reducing the graphene oxides applied on the substrate to provide electrical conductivity for the graphene thin film, after the step (b).

The step (e) reduces the graphene oxides applied on the substrate to provide electrical conductivity for the graphene thin film.

The reduction process on the graphene oxides applied on the substrate is not specifically limited and may be any reduction process commonly used in the related art.

More specifically, in the present invention, the substrate coated with the graphene oxides is put on a glass Petri-dish, and a mixture of the hydrogen iodide (HI) solution and the acetic acid solution is added to the glass Petri-dish carefully so as not to be in direct contact with the substrate coated with the graphene oxides. The glass Petri-dish is sealed up and then heated to reduce the graphene oxides applied on the substrate.

The volume ratio of the hydrogen iodide (HI) solution and the acetic acid solution is not specifically limited, but preferably in the range from 1:1 to 1:9. The volume ratio of the hydrogen iodide (HI) solution and the acetic acid solution controlled within the above-defined range can reduce the graphene oxides applied on the substrate while using a reduced amount of the hydrogen iodide that is harmful to the human body.

The heating means for the glass Petri-dish is not specifically limited and may be any heating means commonly used in the related art. In the present invention, examples of the heating means may include, but are not limited to, a hot plate or an oven.

The heating temperature and the heating time for the glass Petri-dish are not specifically limited and may be appropriately selected in a defined range required to the reduction of the graphene oxides applied on the substrate.

In the production method for graphene thin film according to the present invention, the step (e) is conducted to reduce the graphene oxides applied to the substrate, thereby producing a graphene thin film having electrical conductivity.

The production method for graphene thin film according to the present invention involves applying the graphene oxide solution directly to the substrate by coating, so it can form a graphene thin film on different substrates without a need for conducting a separate transferring process.

The present invention is also directed to a transparent electrode including the graphene thin film produced by the production method for graphene thin film according to the present invention.

The transparent electrode according to the present invention includes the graphene thin film produced by the production method for graphene thin film according to the present invention.

The graphene thin film produced by the above-described production method for graphene thin film according to the present invention satisfies the general requirements to transparent electrodes, such as sheet resistance and transmittance, and has good flexibility, so it can be suitably used as a transparent electrode.

The structure and the production method for the transparent electrode of the present invention are not specifically limited and may include the structure and the production method commonly used in the related art, as long as the transparent electrode includes the graphene thin film produced by the production method for graphene thin film according to the present invention.

MODES FOR CARRYING OUT THE INVENTION

Hereinafter, a further detailed description will be given as to the present invention with reference to examples, which are not intended to limit the scope of the present invention.

Example 1

Preparation of Graphene Oxide Solution

The graphene oxide solution synthesized by the modified Hummers method using the solution process was subjected to spin-down in a centrifugal separator (WiseSpin CF-10) at 8,000 rpm for 10 minutes to uniformly disperse aggregating graphene oxide flakes to a thickness of 1 to 10 layers, thereby preparing a graphene oxide solution. The concentration of the graphene oxide solution was 2.4 mg/ml.

Pretreatment for Substrate

A sulfuric acid solution (95 wt %) and a hydrogen peroxide solution (30 wt %) were mixed at a volume ratio of 1:1 to prepare a piranha solution. A glass substrate was immersed in the piranha solution for 30 minutes and taken out. Deionized water was used to wash the surface of the substrate several times. This eliminated foreign substances from the surface of the substrate and provided hydrophilic functional groups for the surface of the substrate.

Injection of Graphene Oxide Solution

As illustrated in FIG. 1 to FIG. 7, the pretreated glass substrate was placed in parallel with a reciprocating linear motion device (AL-1515-3S, manufactured by Micro Motion Technology). Then, a glass deposition plate connected to the reciprocating linear motion device was placed on the glass substrate to be in contact with the glass substrate at an acute angle of 30° with the glass substrate. The graphene oxide solution was then injected by way of a micropipette in the direction of the obtuse angle between the glass substrate and the glass deposition plate in contact with each other. The volume of the graphene oxide solution injected was 40 μl per inch (length) of a contact interface between the substrate and the deposition plate.

Coating with Graphene Oxide Solution Using Reciprocating Linear Motion of Deposition Plate The glass deposition plate connected to the reciprocating linear motion device was put in contact with the glass substrate to maintain an acute angle of 30° with the glass substrate. Meanwhile, the reciprocating linear motion device was used to put the glass deposition plate into reciprocating linear motion at 10 mm/sec to apply the graphene oxide solution onto the glass substrate 20 times.

Reduction Treatment on Substrate Coated with Graphene Oxide Solution

The glass substrate coated with the graphene oxide solution was put in a glass Petri-dish. 1 ml of a mixture of the hydrogen iodide (HI) solution (55 wt %) and the acetic acid solution (99.7 wt %) at volume ratio of 2:5 was added to the glass Petri-dish carefully so as not to be in direct contact with the glass substrate coated with the graphene oxides. The glass Petri-dish was sealed up and then heated on a hot plate at 80° C. for 3 hours to reduce the graphene oxides applied on the substrate, thus forming a graphene thin film.

Examples 2 to 8

The procedures were performed in the same manner as described in Example 1, excepting that in the step of applying the graphene oxide solution using the reciprocating linear motion of the deposition plate, the number of reciprocating linear motions of the deposition plate, that is, the reciprocating coating frequency of the graphene oxide solution was varied as 1 (Example 2), 5 (Example 3), 10 (Example 4), 40 (Example 5), 60 (Example 6), 80 (Example 7), and 100 (Example 8).

Examples 9 to 12

The procedures were performed in the same manner as described in Example 1, excepting that in the step of preparing the graphene oxide solution, the concentration of the graphene oxide solution was varied as 0.6 mg/ml (Example 9), 1.2 mg/ml (Example 10), 3.0 mg/ml (Example 11), and 4.0 mg/ml (Example 12).

Examples 13 and 14

The procedures were performed in the same manner as described in Example 1, excepting that in the step of injecting the graphene oxide solution, the acute angle between the glass substrate and the glass deposition plate in contact with each other was varied as 18° (Example 13) and 42° (Example 14).

Examples 15 and 16

The procedures were performed in the same manner as described in Example 1, excepting that in the step of applying the graphene oxide solution using the reciprocating linear motion of the deposition plate, the reciprocating linear motion speed of the deposition plate was varied as 1.6 mm/sec (Example 15) and 30 mm/sec (Example 16).

Example 17

The procedures were performed in the same manner as described in Example 1, excepting that in the step of conducting a pretreatment on the substrate, a polyethylene film was used in place of the glass substrate.

Example 18

The procedures were performed in the same manner as described in Example 1, excepting that in the step of conducting a pretreatment on the substrate, a polydimethylsiloxane (PDMS) film was used in place of the glass substrate.

Example 19

The procedures were performed in the same manner as described in Example 1, excepting that in the step of conducting a pretreatment on the substrate, a silicon wafer was used in place of the glass substrate.

Experimental Example 1

Thickness Measurement of Graphene Thin Film

The graphene thin films prepared in Examples 1 to 12 were measured in regards to the thickness using an atomic force microscope (AFM; PSIA XE-100).

Figure 9:
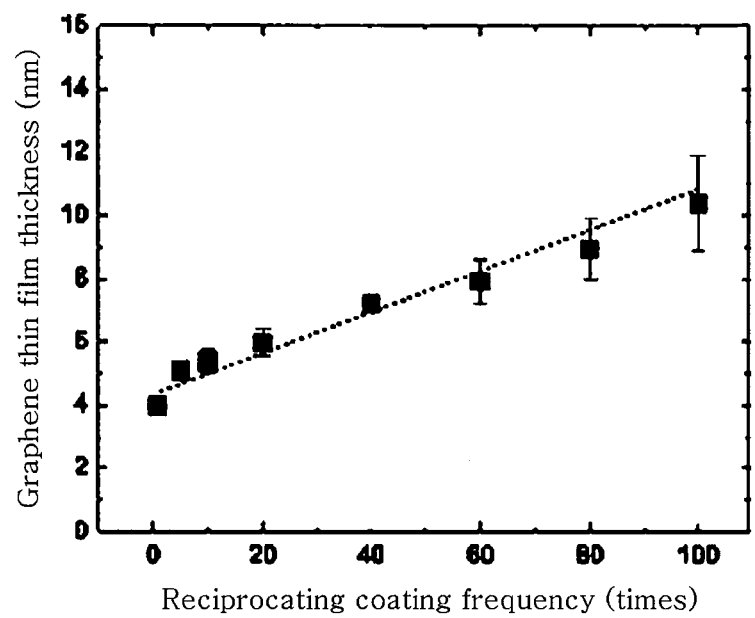
FIG. 9 is a graph showing the thickness of the graphene thin film as a function of the reciprocating coating frequency of the graphene oxide solution.

FIG. 9 is a graph showing the thickness of the graphene thin film as a function of the reciprocating coating frequency of the graphene oxide solution. In Examples 1 to 8, the only one condition changed in the fabrication of a graphene thin film was the reciprocating coating frequency of the graphene oxide solution. As can be seen from FIG. 9, the thickness of the graphene thin film was in linear proportion to the reciprocating coating frequency under the condition that the concentration of the graphene oxide solution was constant.

Figure 10:
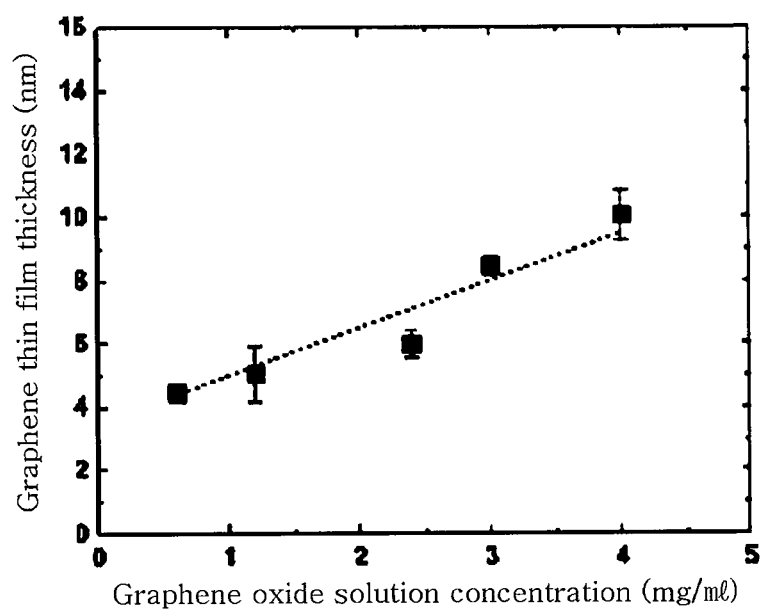
FIG. 10 is a graph showing the thickness of the graphene thin film as a function of the concentration of the graphene oxide solution.

FIG. 10 is a graph showing the thickness of the graphene thin film as a function of the concentration of the graphene oxide solution. In Examples 1 and 9 to 12, the only one condition changed in the fabrication of a graphene thin film was the concentration of the graphene oxide solution. As can be seen from FIG. 10, the thickness of the graphene thin film was in linear proportion to the concentration of the graphene oxide solution under the condition that the reciprocating coating frequency of the graphene oxide solution was constant.

As can be seen from FIGS. 9 and 10, the production method for graphene thin film according to the present invention can control the thickness of the graphene thin film on a nanometer scale as a function of the reciprocating coating frequency and the concentration of the graphene oxide solution. In other words, the production method for graphene thin film according to the present invention can regulate the thickness of the graphene thin film on a nanometer scale by way of the variables easily controllable, such as the reciprocating coating frequency and the concentration of the graphene oxide solution.

Experimental Example 2

Measurement of Transmittance and Sheet Resistance of Graphene Thin Film

The graphene thin films prepared in Examples 1 and 5 to 16 were measured in regards to the transmittance at a wavelength of 550 nm using a UV spectrometer (Jasco V-670). The graphene thin films prepared in Examples 1 and 5 to 16 were also measured in regards to the sheet resistance according to the 4-probe method (Keithley 2400 Source Meter).

Figure 11:
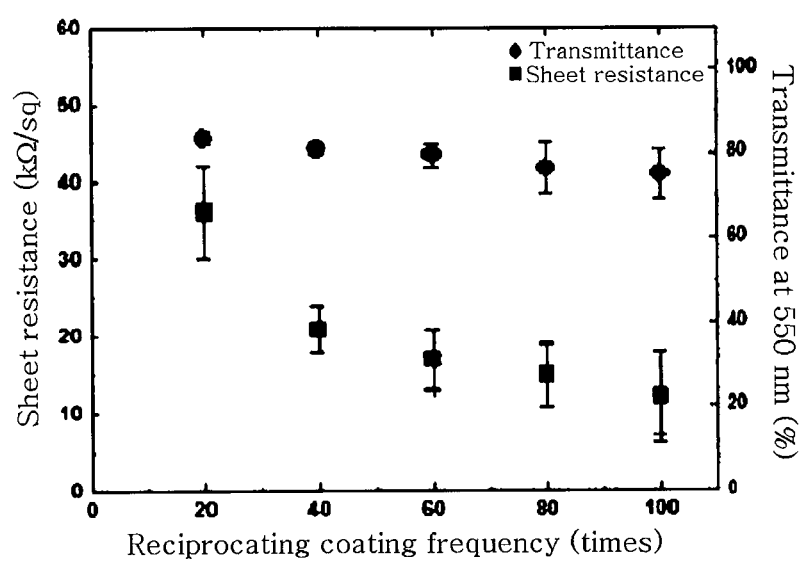
FIG. 11 is a graph showing the transmittance and the sheet resistance of the graphene thin film as a function of the reciprocating coating frequency of the graphene oxide solution.

FIG. 11 is a graph showing the transmittance and the sheet resistance of the graphene thin film as a function of the reciprocating coating frequency of the graphene oxide solution. In Examples 1 and 5 to 8, the only one condition changed in the fabrication of a graphene thin film was the reciprocating coating frequency of the graphene oxide solution. As can be seen from FIG. 11, the transmittance and the sheet resistance of the graphene thin film decreased with an increase in the reciprocating coating frequency under the condition that the concentration of the graphene oxide solution was constant.

Figure 12:
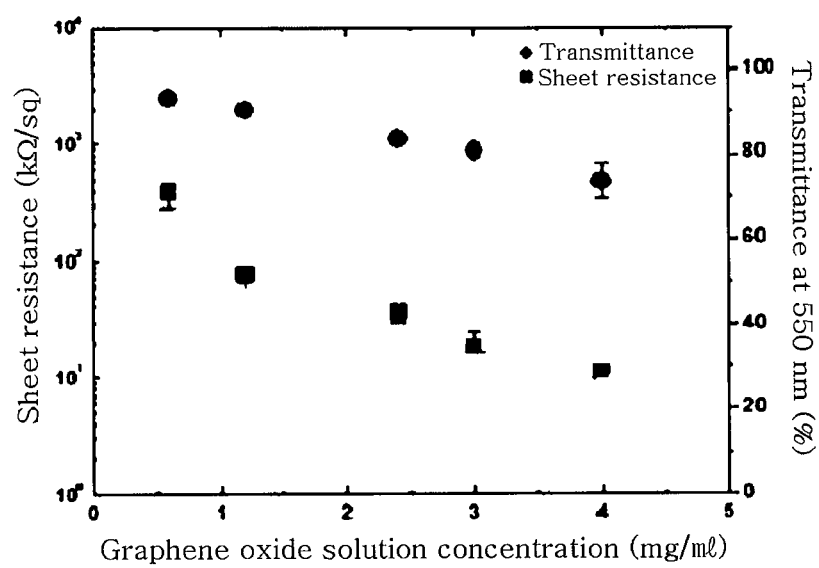
FIG. 12 is a graph showing the transmittance and the sheet resistance of the graphene thin film as a function of the concentration of the graphene oxide solution.

FIG. 12 is a graph showing the transmittance and the sheet resistance of the graphene thin film as a function of the concentration of the graphene oxide solution. In Examples 1 and 9 to 12, the only one condition changed in the fabrication of a graphene thin film was the concentration of the graphene oxide solution. As can be seen from FIG. 12, the transmittance and the sheet resistance of the graphene thin film decreased with an increase in the concentration of the graphene oxide solution under the condition that the reciprocating coating frequency of the graphene oxide solution was constant.

Figure 13:
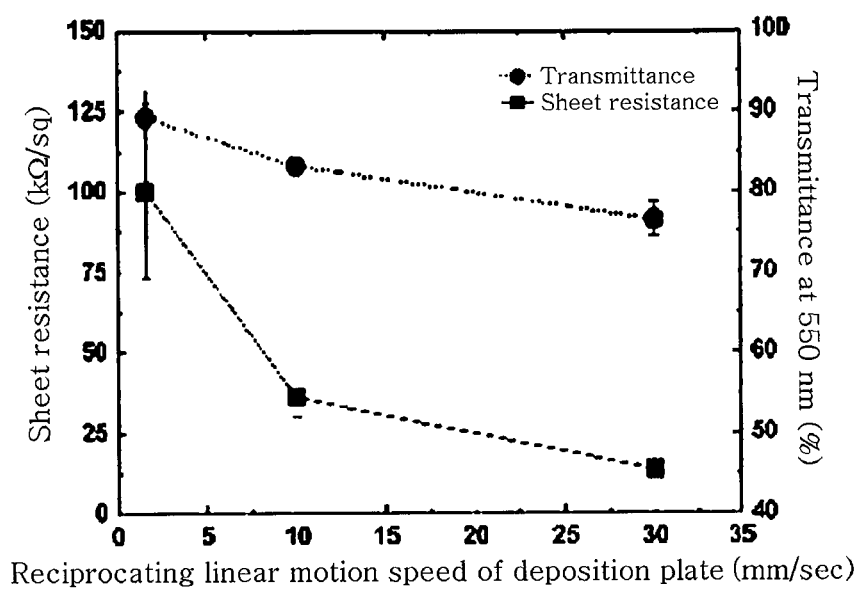
FIG. 13 is a graph showing the transmittance and the sheet resistance of the graphene thin film as a function of the reciprocating linear motion speed of the deposition plate.

FIG. 13 is a graph showing the transmittance and the sheet resistance of the graphene thin film as a function of the reciprocating linear motion speed of the deposition plate. In Examples 1, 15 and 16, the only one condition changed in the fabrication of a graphene thin film was the reciprocating linear motion speed of the deposition plate. As can be seen from FIG. 13, the transmittance and the sheet resistance of the graphene thin film decreased with an increase in the reciprocating linear motion speed of the deposition plate.

Figure 14:
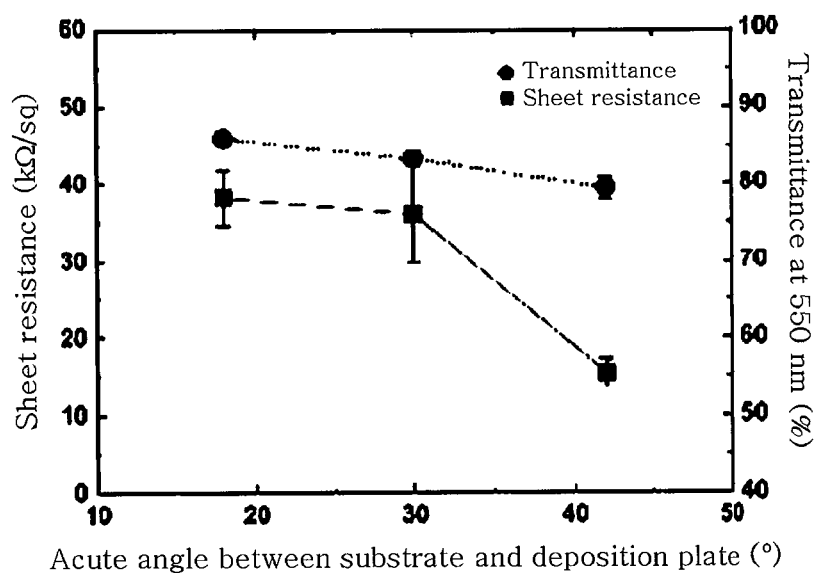
FIG. 14 is a graph showing the transmittance and the sheet resistance of the graphene thin film as a function of the acute angle between the substrate and the deposition plate.

FIG. 14 is a graph showing the transmittance and the sheet resistance of the graphene thin film as a function of the acute angle between the substrate and the deposition plate. In Examples 1, 13 and 14, the only one condition changed in the fabrication of a graphene thin film was the acute angle between the substrate and the deposition plate. As can be seen from FIG. 14, the transmittance and the sheet resistance of the graphene thin film decreased with an increase in the acute angle between the substrate and the deposition plate.

It can be seen from FIGS. 9 to 12 that the transmittance and the sheet resistance of the graphene thin film were intimately related with the thickness of the graphene thin film. In other words, the transmittance and the sheet resistance of the graphene thin film decreased with an increase in the thickness of the graphene thin film.

In addition, it can be seen from FIGS. 13 and 14 that an increase in the reciprocating linear motion speed of the deposition plate increased the thickness of the graphene thin film and thus decreased the transmittance and the sheet resistance of the graphene thin film; and that an increase in the acute angle between the substrate and the deposition plate increased the thickness of the graphene thin film and thus decreased the transmittance and the sheet resistance of the graphene thin film.

In conclusion, the production method for graphene thin film according to the present invention can control the thickness of the graphene thin film by regulating, among the fabrication conditions, not only the reciprocating coating frequency and the concentration of the graphene oxide solution but also the reciprocating linear motion speed of the deposition plate and the acute angle between the substrate and the deposition plate. Finally, this can control the optical and electrical properties of the graphene thin film. In other words, the production method for graphene thin film according to the present invention can produce a graphene thin film having optical and electrical properties required to a transparent electrode by controlling various conditions of the fabrication.

Therefore, the production method for graphene thin film according to the present invention can use a smaller amount of the graphene oxide solution than the conventional production methods for graphene thin film to prepare a graphene thin film having optical and electrical properties equivalent or better and produce a uniform and large-area graphene thin film in a short process time.

Experimental Example 3

Picture of Graphene Thin Film

The pictures of the graphene thin films prepared in Examples 1 and 17 to 19 were taken with a digital camera.

Figure 15:
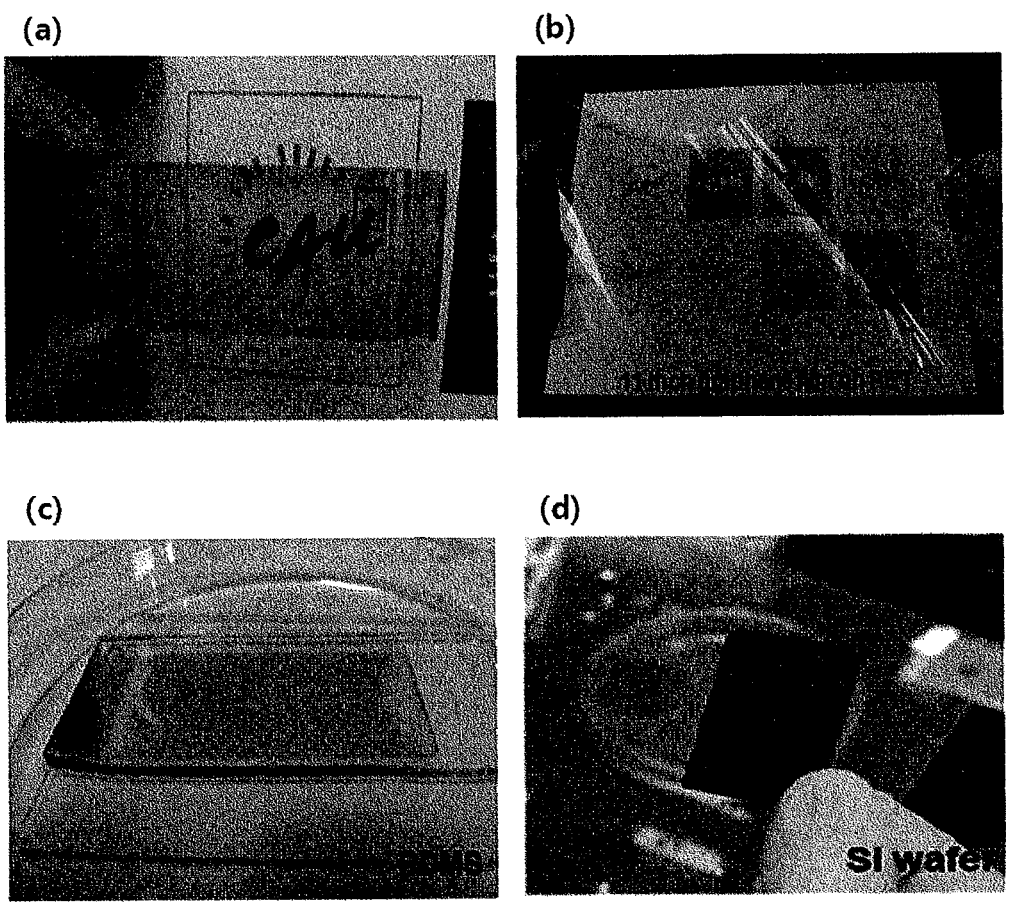
FIGS. 15 (a), 15 (b), 15 (c), and 15 (d) show pictures of graphene thin films prepared in Examples 1, 17, 18 and 19, (a) formed on a glass substrate, the graphene thin film (b) on a polyethylene film, the graphene thin film (c) on a polydimethylsiloxane (PDMS) film, and the graphene thin film (d) on a silicon (Si) wafer.

FIG. 15 shows the pictures of graphene thin films prepared in Examples 1 and 16 to 18. As can be seen from FIG. 15, the graphene thin film (a) formed on a glass substrate, the graphene thin film (b) on a polyethylene film, the graphene thin film (c) on a polydimethylsiloxane (PDMS) film, and the graphene thin film (d) on a silicon (Si) wafer demonstrated that the production method for graphene thin film according to the present invention could produce a graphene thin film directly on different substrates, thus eliminate a need for the separate transferring process, and allow the graphene thin film formed on a flexible substrate to be used as a flexible transparent electrode.

What is claimed is:

1. A production device for graphene thin film, comprising:
a deposition plate in contact with a substrate at an obtuse or acute angle, wherein the substrate is coated with a graphene oxide solution;
a reciprocating linear motion device connected to the deposition plate to put the deposition plate into reciprocating linear motion;
a holder for supporting the deposition plate;
an angle adjusting device for rotatably supporting the holder, for adjusting an angle between the substrate and the deposition plate, and for maintaining the adjusted angle;
a support fixture for supporting the substrate;
a height adjusting device for adjusting a height of the support fixture to adjust an angle between the substrate and the deposition plate;
a heating device installed in the support fixture to heat the substrate;
a temperature adjusting device for adjusting a heating temperature of the heating device;
an injecting device for injecting the graphene oxide solution; and
an injection tube connected to the injecting device,
wherein the holder comprises a body; a groove formed in a side of the body to receive an end portion of the deposition plate; connecting members respectively extending from both end portions of the body; and an axis receiving hole respectively formed in the connecting members,
wherein the reciprocating linear motion device comprises an axis receiving hole, an end portion of the reciprocating linear motion device is inserted between the connecting members of the holder, so that the axis receiving hole of the holder is aligned with the axis receiving hole of the reciprocating linear motion device,
wherein the angle adjusting device comprises a rotating axis respectively inserted into the axis receiving hole of the holder and the axis receiving hole of the reciprocating linear motion device; and a fixing member engaging with the rotating axis to fix the holder and the reciprocating linear motion device,
wherein the rotating axis and the fixing member are screw-coupled,
wherein the deposition plate comprises a fixing member for fixing the injection tube.

* * * * *